(12) United States Patent
Gamboa et al.

(10) Patent No.: US 6,901,217 B2
(45) Date of Patent: May 31, 2005

(54) CONDUITS INTEGRATED IN CIRCUIT BOARD AND METHOD OF MANUFACTURE

(75) Inventors: Claudia V. Gamboa, Chicago, IL (US); Manes Eliacin, Buffalo Grove, IL (US); Keryn K. Lian, Palatine, IL (US)

(73) Assignee: Motorolr, Inc., Schaumburg, IL (US)

( * ) Notice: Subject to any disclaimer, the term of this patent is extended or adjusted under 35 U.S.C. 154(b) by 177 days.

(21) Appl. No.: 10/376,577

(22) Filed: Feb. 28, 2003

(65) Prior Publication Data

US 2004/0170410 A1 Sep. 2, 2004

(51) Int. Cl.[7] ................................................. F24H 1/10
(52) U.S. Cl. ........................ 392/484; 219/543; 216/39
(58) Field of Search ............................. 216/33, 39, 41, 216/44; 392/484, 465, 466; 137/15.7

(56) References Cited

U.S. PATENT DOCUMENTS

| | | | |
|---|---|---|---|
| 4,935,040 A | * | 6/1990 | Goedert ...................... 73/23.22 |
| 5,470,693 A | * | 11/1995 | Sachdev et al. ............. 430/315 |
| 6,517,736 B1 | * | 2/2003 | Flannery et al. .............. 216/33 |
| 2002/0174935 A1 | | 11/2002 | Burdon et al. |
| 2002/0174937 A1 | | 11/2002 | Burden et al. |

FOREIGN PATENT DOCUMENTS

WO        WO 00/21659        4/2000

OTHER PUBLICATIONS

A. Wego, et.al "Fluidic Microsystems Based on Printed Circuit Board Technology,", J. Micromech. Microeng. 11 (2001) 528–531.

T. Merkel et al., "A New Technology for Fluidic Microsystems based on PCB Technology," Sensors and Actuators 77 (1999) 98–105.

J. Savic et al, Embedded Passives Technology Implementation in RF Applications, http://www.ciruitree.com/ct/cda/articleinformation/features/bnp_features_item/0,2133, 77806,00. html, posted Jun. 6, 2001.

ILFACool—Integrated Micro Cooling System for Electronic Assemblies, Publication of Ilfa GmbH Hannover, Aug. 15, 1999.

Rebenklau, Lars, Realization of Microfluidic Modules using LTCC, IMAPS Poland, 2000, http://www.cyf-kr.edu.pl/academic/OBRMHiR/imaps/data/txt/txt08.htm.

Product Brochure Probelec Leading Edge Liquid Epoxy Dielectric Technology, undated.

C. F. Chou et al, A Miniaturized Cyclic PCR Device—Modeling and Experiments, Microelectronic Engineering, 61–62 (2002), pp. 921–925.

D. J. Sadler et al, Thermal Management of BioMEMS, Proceedings of ITherm 2002, pp. 1025–1032, San Diego, CA, May 30–Jun. 1, 2002.

C. R. Tamanaha et al, "Hybrid Macro–Micro Fluidics System for a Chip–Based Biosensor,", J. Micromech. Microeng. 12 (2002) N7–N17.

M.A. Kopp, et al "Chemical Amplification: Continuous–Flow PCR on a Chip" Science vol. 280 (May 15, 1998). PP. 1046–1048.

C. F. Chou, R. et al, A Miniaturized Cyclic PCR Device, Proceedings of μTAS 2001 Symposium, pp. 151–152, Monterey, CA, Oct. 21–25, 2001.

D. Wilcox et al, Add Ceramic MEMS to the Pallet of MicroSystems Technologies, MRS Fall Meeting, vol. 687, Boston, MA, Nov., 2001.

* cited by examiner

Primary Examiner—Thor Campbell

(57) ABSTRACT

Circuit boards (1100, 1400) and methods for fabricating circuit boards that include conduits (1004) are provided. The conduits formed by patterning a metal layer (1102) are lined by inert coating (1106) and caped by a photodefinable polymer layer (1110) that is affixed to the inert coating by with the help of an initially uncured polymer layer (1106). Holes are formed by patterning the photodefinable polymer layer for admitting and removing fluid from the conduit.

20 Claims, 8 Drawing Sheets understand

CONDUITS INTEGRATED IN CIRCUIT BOARD AND METHOD OF MANUFACTURE

FIELD OF THE INVENTION

The present invention relates in general to integrated electromechanical apparatus manufacturing. More particularly, the present invention relates to integrated conduits for printed circuit boards.

BACKGROUND OF THE INVENTION

Advances in semiconductor manufacturing technology have enabled complex electronic systems (e.g., computers, wireless telephones) to be integrated into relatively small size packages. The advances in semiconductor manufacturing technology have been accompanied by advances in circuit board technology. Advanced circuit boards facilitate interconnection of high pin count semiconductor packages.

Systems that include electrical circuits of varying complexity along with conduits, (e.g., fluid conduits) are used for a variety of applications. Such conduits are typically provided in the form of separate components that assembled with electrical components in an apparatus. Such separate conduits, increase the cost, and increase the space occupied by such apparatus. Given the current trend toward reducing the size of complex apparatus it is preferable to conserve as much space as possible without adversely effecting the cost. For example, reducing the size and cost of medical testing equipment that includes one or more fluid conduits can be expected to lead to proliferation of more advanced diagnostic equipment among doctors. More generally, reducing the size and cost of other types of devices that include conduits generally results in greater convenience for users of the devices.

BRIEF DESCRIPTION OF THE FIGURES

The present invention will be described by way of exemplary embodiments, but not limitations, illustrated in the accompanying drawings in which like references denote similar elements, and in which.

DETAILED DESCRIPTION OF THE PREFERRED EMBODIMENTS

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

Figure 1:
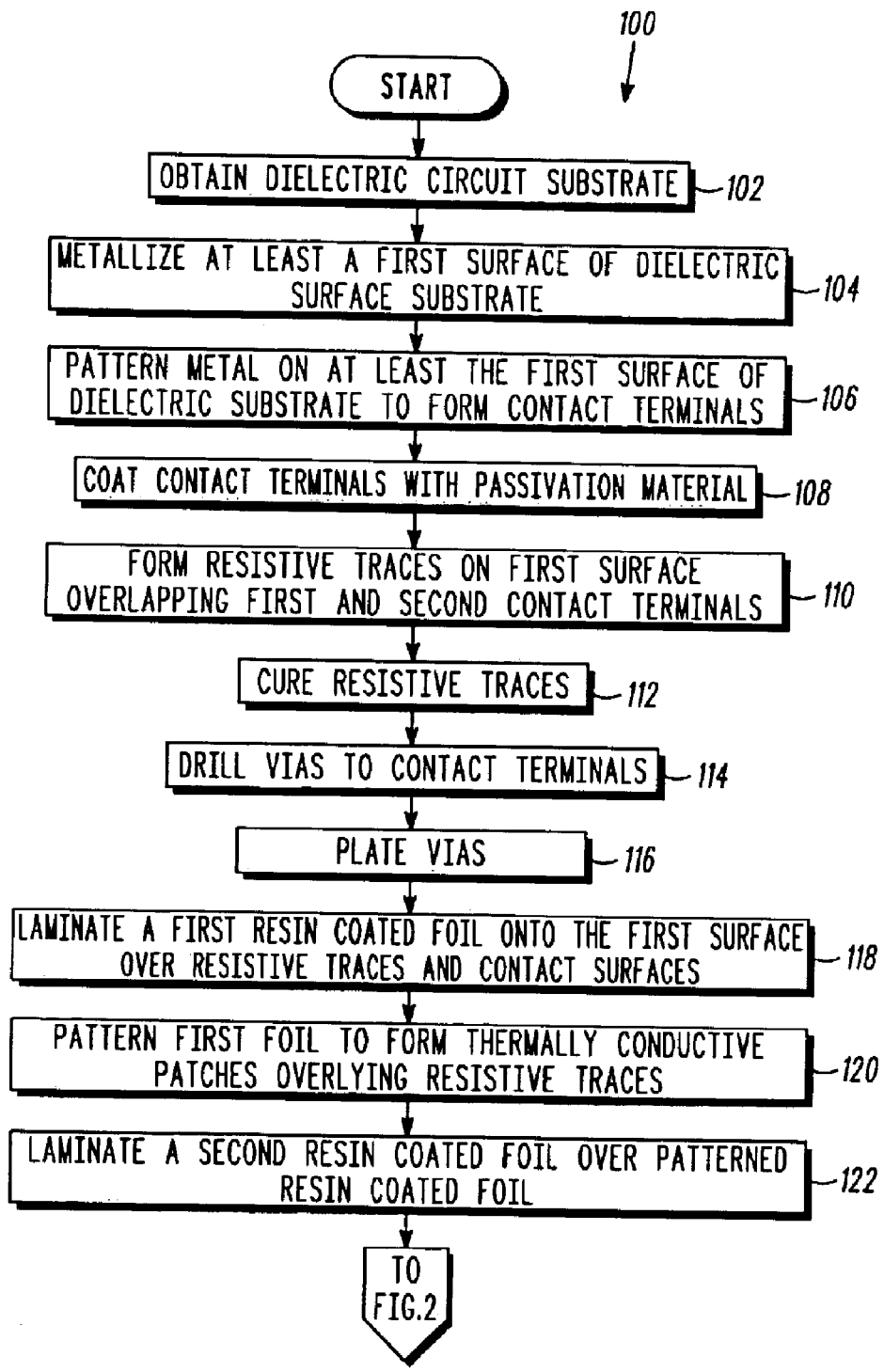
FIG. 1 is a first part of a flow chart of a method of fabricating a circuit board based integrated heater and fluid conduit according to the preferred embodiment of the invention.
Figure 2:
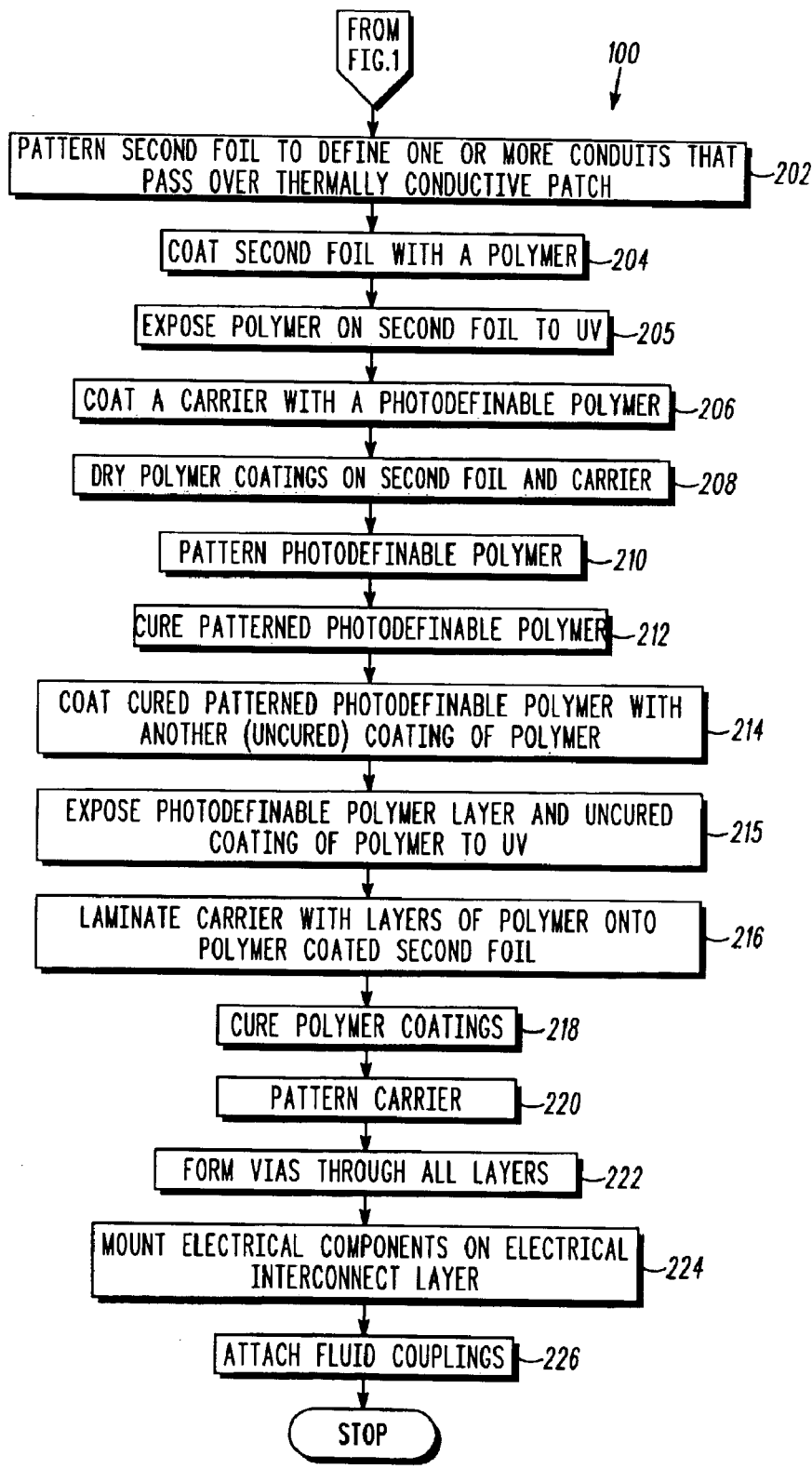
FIG. 2 is a second part of the flow chart begun in FIG. 1.
Figure 3:
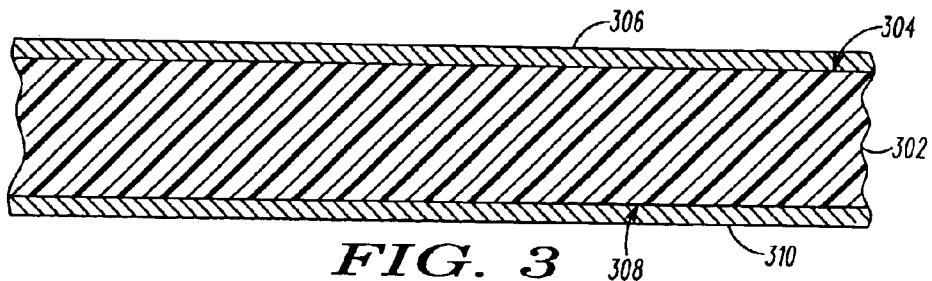
FIG. 3 is a fragmentary sectional elevation view at an intermediate stage of the method shown in FIGS. 1–2 at which a dielectric substrate is metallized on both sides.
Figure 4:
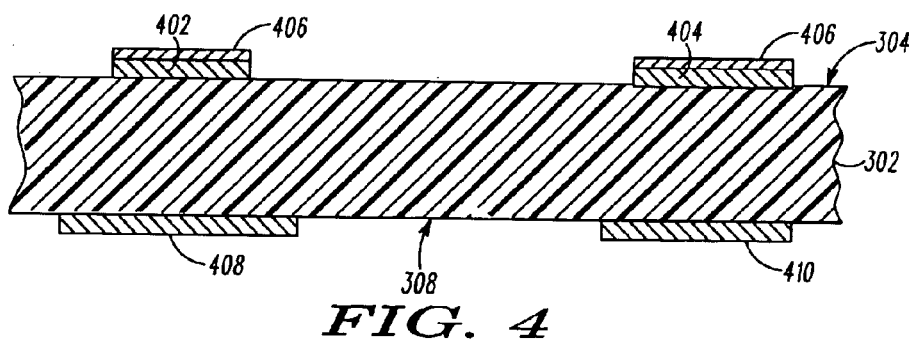
FIG. 4 is a fragmentary sectional elevation view at an intermediate stage of the method shown in FIGS. 1–2 at which passivated contacts have been formed on the dielectric substrate shown in FIG. 3.

FIGS. 1–2 show a flow chart of a method 100 of fabricating a circuit board based integrated heater and fluid conduit 1100 (FIG. 11) according to the preferred embodiment of the invention, and FIGS. 3–11 shown the integrated heater and fluid conduit 1100 at different stages of fabrication. In the description that follows the leading digit of each reference numeral indicates the FIG. in which the referenced part first appears. The integrated heater and fluid conduit 1100 is fabricated on a portion of a dielectric circuit substrate 302, shown in FIGS. 3–11. Other electrical circuits or fluidic, thermal or mechanical devices that interoperate with, or are independent of the integrated heater and fluid conduit 1100 can be fabricated on other parts of the dielectric circuit substrate 302. Advantageously, the integrated heater and fluid conduit 1100 is suitable for integration with other components on a circuit substrate 302.

In step 102 the dielectric circuit substrate 302 is obtained. The dielectric circuit substrate 302 preferably comprises a base substrate that includes organic resin impregnated fiber glass. The dielectric circuit substrate 302 is alternatively a flexible circuit substrate such as a flexible polyester, or a flexible polyimide circuit substrate.

In step 104 a first surface 304 of the dielectric circuit substrate 302 is metallized with a first metal film 306 and preferably a second surface 308 of the dielectric circuit substrate is metallized with a second metal film 310. The first 306 and second 310 metal films are preferably separately manufactured and laminated to the dielectric circuit substrate 302. An adhesive (not shown) is optionally used to bond the metal films 306, 310 to the dielectric circuit substrate. Alternatively, the metal films 306, 310 are formed on the substrate 302, e.g., by electroless, and electro plating processes.

Figure 5:
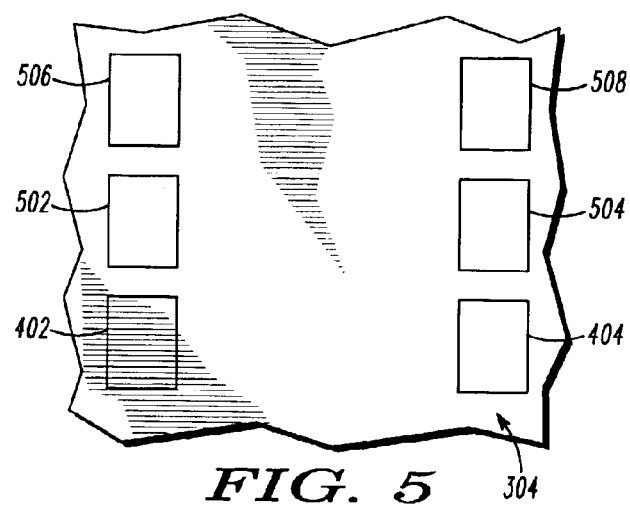
FIG. 5 is a plan view corresponding to FIG. 4, and showing the layout of the contacts shown in FIG. 4.
Figure 6:
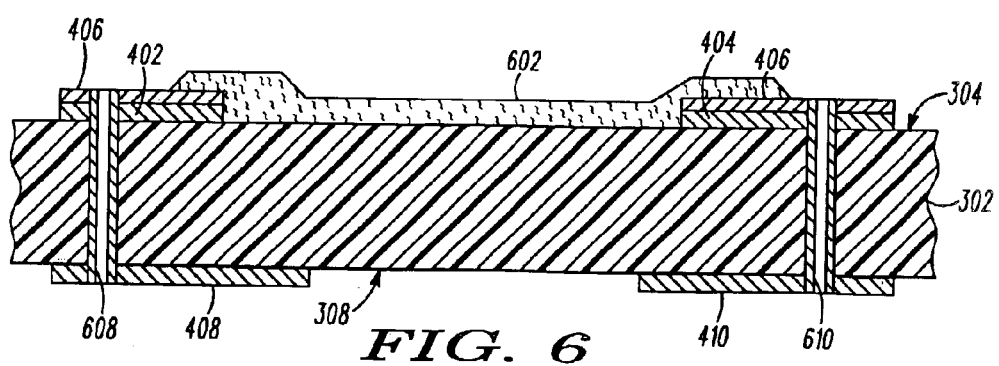
FIG. 6 is a fragmentary sectional elevation view at an intermediate stage of the method shown in FIGS. 1–2 at which resistive traces have been printed on the dielectric substrate overlapping the passivated contacts shown in FIGS. 4 and 5.
Figure 7:
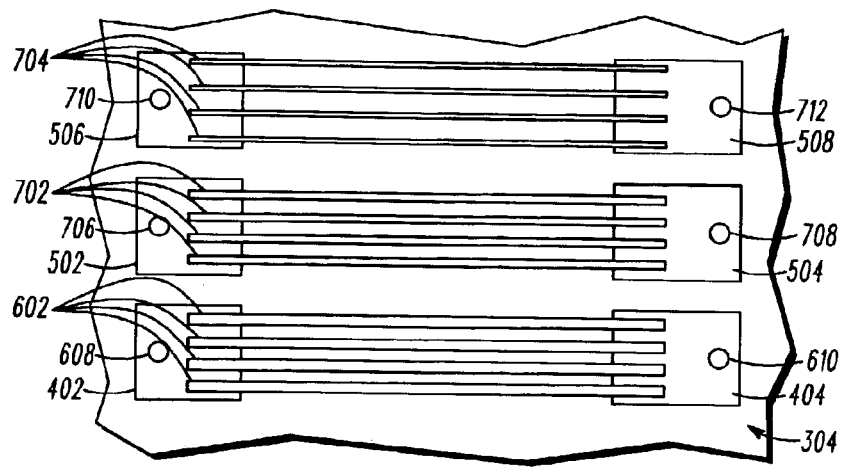
FIG. 7 is a plan view corresponding to FIG. 6, and showing the layout of the resistive traces with respect to the passivated contacts.
Figure 8:
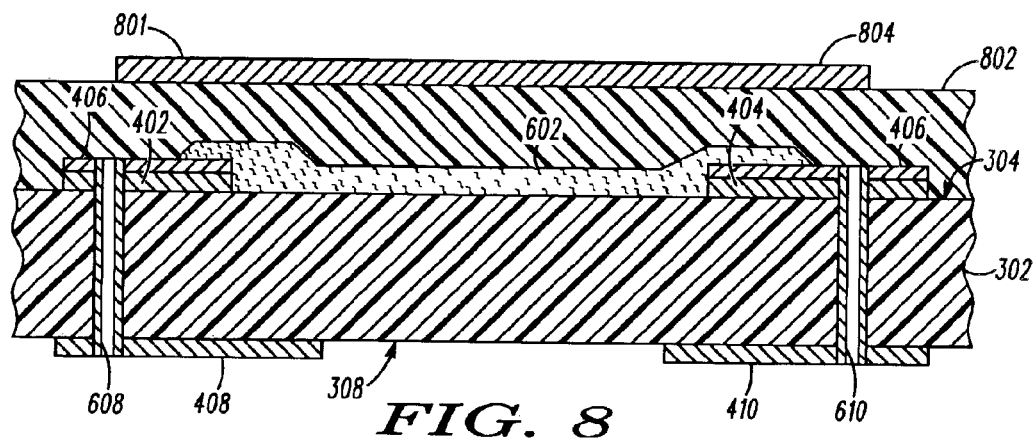
FIG. 8 is a fragmentary sectional elevation view at an intermediate stage of the method shown in FIGS. 1–2 at which a second dielectric layer has been attached over the resistive traces, and thermally conductive patches have been formed on the second dielectric layer aligned with the resistive traces.
Figure 9:
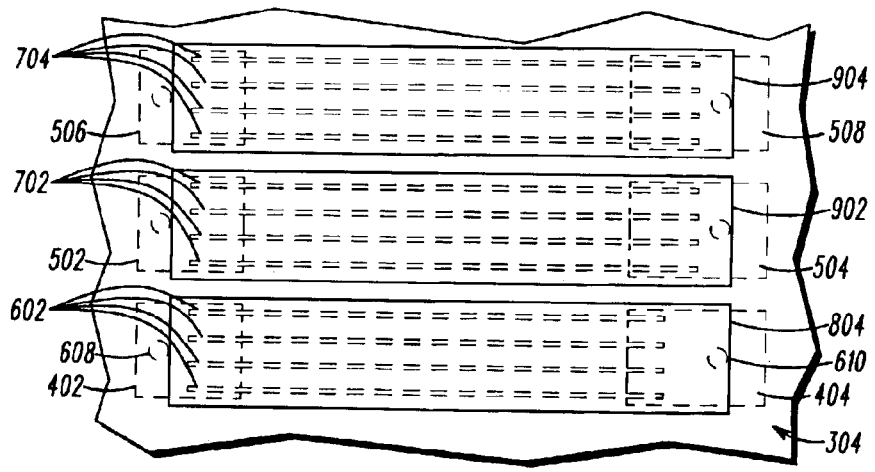
FIG. 9 is an x-ray plan view corresponding to FIG. 8 and showing the layout of thermally conductive patches with respect to the resistive traces.
Figure 10:
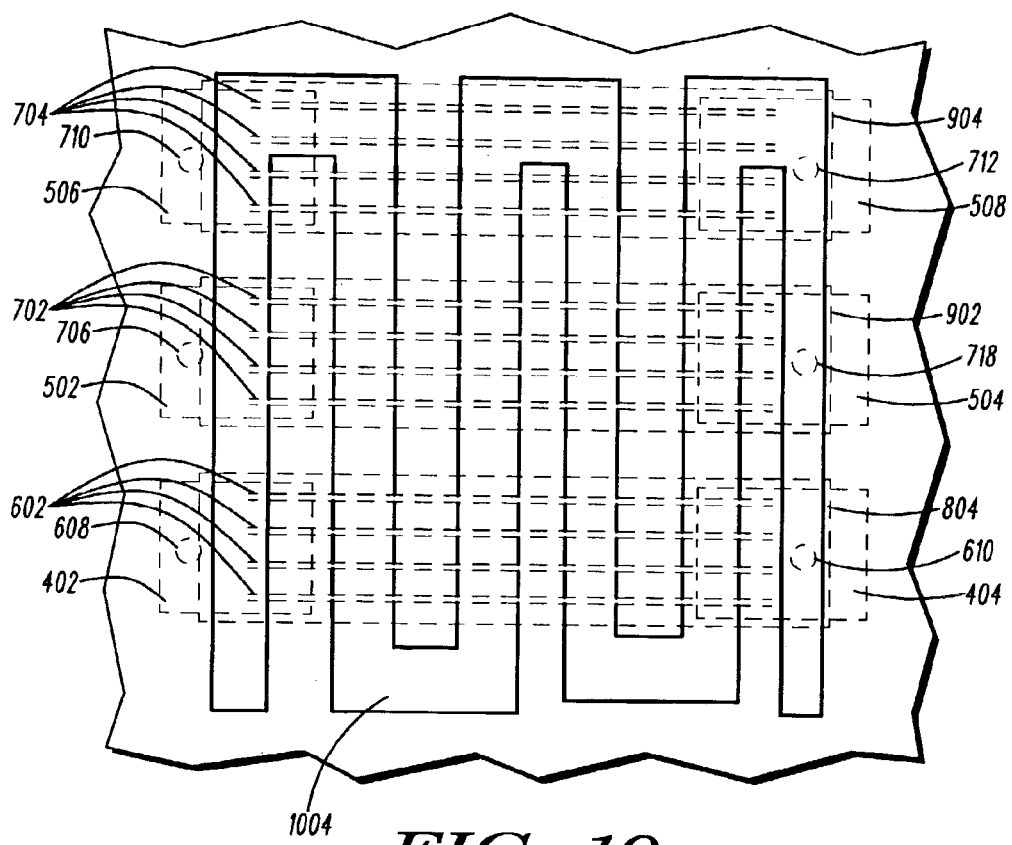
FIG. 10 is an x-ray plan view at an intermediate stage of the method shown in FIGS. 1–2 at which a third dielectric layer and a metal layer have been positioned over the second dielectric layer, and a channel etched through the metal layer.
Figure 11:
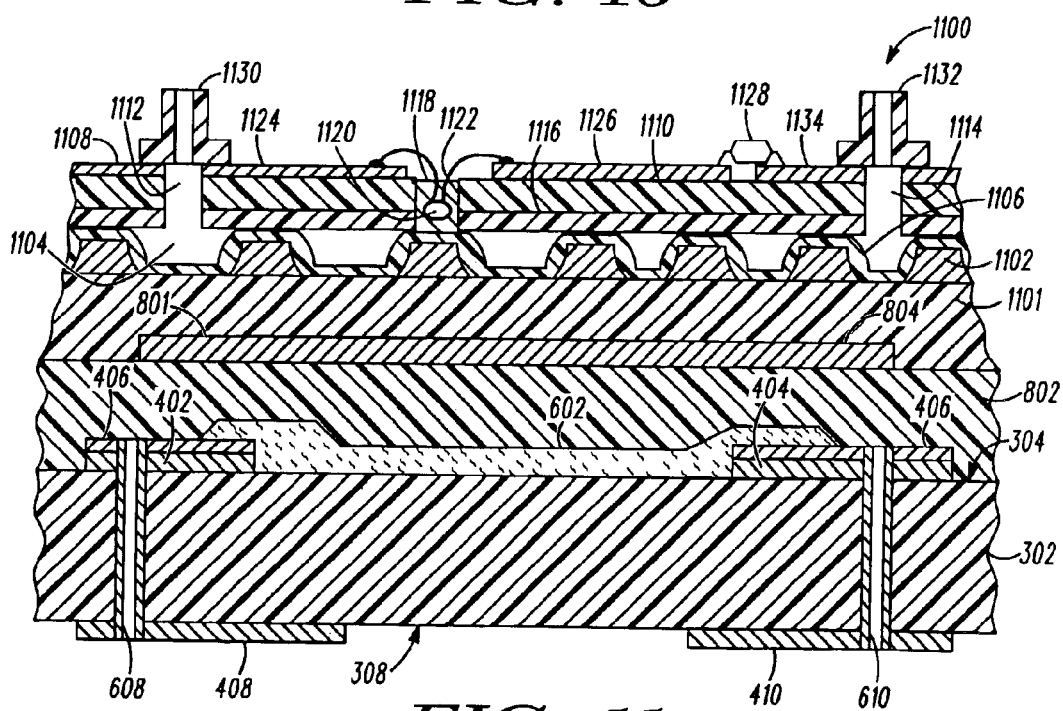
FIG. 11 is a fragmentary sectional elevation view of the circuit board based integrated heater and fluid conduit according to the preferred embodiment of the invention.

In step 106 the first metal film 306 is patterned to form a first contact terminal 402, and a second contact terminal 404 as well as a third contact terminal 502, a fourth contact terminal 504, a fifth contact terminal 506, and sixth contact terminal 508. The layout of the contact terminals 402, 404, 502–508 is shown in FIG. 5. The contact terminals comprise patches of metal etched from the first metal film 306. In step 106, the second metal film 310 is also patterned to form a first metallization trace 408 and a second metallization trace 410 on the second surface 308 of the substrate 302.

The contact terminals 402, 404, 502–508 and the metallization traces 408, 410 are preferably formed by applying photoresist to the first 306 and second 310 metal films, imagewise exposing the photoresist, developing the photoresist, and thereafter etching the first 306 and second 310 metal films with a liquid etchant using the photoresist as a mask. In step 106 other portions of the first 306 and second 310 metal films (not shown) can also be patterned to form electrical interconnects, or other structures for components that are fabricated on other portions (not shown) of the dielectric circuit substrate 302.

In step 108 a passivation coating 406 is applied to the contact terminals 402, 404, 502–508. The passivation coating 406 aids in maintaining low resistance electrical contact between the contact terminals 402, 404 502–508 and a resistive ink, that is subsequently applied, during a process of curing the resistive ink and thereafter. The passivation coating 406 preferably comprises nickel, tin, gold, silver or a combination thereof. Alternatively, the passivation coating 406 is not used.

In step 110 resistive traces including a first set of resistive traces 602, a second set of resistive traces 702, and a third set of resistive traces 704 are formed on the first surface 304 overlapping the contact terminals 402, 404, 502–508. The first set of resistive traces 602 extends between the first contact terminal 402, and the second contact terminal 404. The second set of resistive traces 702 extends between the third contact terminal 502, and the fourth contact terminal 504, and similarly the third set of resistive traces 704 extends between the fifth contact terminal 506 and the sixth contact terminal 508. The resistive traces 602, 702, 704 are conductors used for controlled heating. The resistance of the traces within each set of traces 602, 702, 704 is preferably chosen to obtain a certain heating power. The resistance can be controlled by controlling the thickness, width, length or resistivity of the resistive traces 602, 702, 704. Alternatively, the resistance of all the traces 602, 702, 704 is the same and heating power is controlled by selecting voltages applied to the resistive traces 602, 702, 704. The resistive traces 602, 702, 704 are preferably formed by printing a resistive ink. More preferably, the resistive traces 602, 702, 704 are formed by screen printing. The resistive ink composition preferably comprises conductive particles such as silver or carbon particles in a polymeric binder, along with a solvent. The solvent is driven off in a subsequent curing step. Alternatively, an ultraviolet curable polymeric binder is employed. In the latter case the process of curing comprises exposure to ultraviolet light. Examples of suitable resistive inks are carbon filled phenolic resins such as that sold under the trade name "TU-00-8" by Asahi corporation of Tokyo, Japan, or resistive ink sold under the trade name Electrad'or by Electra corporation of Kent, England.

Alternatively, the resistive ink comprises a positive temperature coefficient of resistance (PTCR) material. Resistive traces that include a PTCR material are, to a degree, self regulating, in so far as they tend to maintain a stable temperature, even when thermally coupled to variable heat sinks or sources, and supplied by a varying voltage supply. Suitable PTCR resistive inks include that sold under the trade designation "7282 PTC ink" by Dupont MCM of Research Triangle Park, N.C.

Referring again to FIG. 1, in step 112 the resistive traces are cured. Curing preferably comprises ultraviolet exposure and/or heating.

According to an alternative embodiment the resistive traces 602, 702, 704 are formed from nickel phosphorous alloy. Alternatively, resistive traces 602, 702, 704 and their associated contact terminals 402, 404, 502–508 are integrally formed from a single metal layer such as for example nickel phosphorous alloy.

In step 114 a first via 608 is drilled through the first metallization trace 408, the dielectric circuit substrate 302, and the first terminal contact 402, and a second via 610 is drilled through the second metallization trace 410, the dielectric circuit substrate 302, and the second contact terminal 404. A third 706, a fourth 708, a fifth 710, and a sixth 712 via that are used to couple additional metallization traces (not shown) to the third 502, fourth 504, fifth 506, and sixth 508 contact terminals respectively are also drilled. Other vias used to interconnect other traces, and contact terminals (not shown) on different parts of the dielectric circuit substrate are also preferably be drilled at this time.

In step 116 the first 608 and second 610 vias are plated to form a first conductive connection between the first metallization trace 408, and the first contact to terminal 402, and a second conductive connection between the second metallization trace 410, and the second contact terminal 404. In step 116 the third through sixth vias 706–712 are also plated to form conductive connections to metallization traces (not shown) on the second surface 308 of the dielectric circuit substrate 302.

In step 118 a first organic resin coated foil is laminated on the first surface 304 of the dielectric circuit substrate 302 over the contract terminals 402, 404, 502–508 and the resistive traces 602, 702, 704. An organic resin layer 802 of the first organic resin coated foil faces the first surface 304. A foil 801 of the first organic resin coated foil preferably comprises copper. The organic resin layer 802 of the organic resin coated foil is a dielectric and preferably comprises a partially cured epoxy. Alternatively, in lieu of laminating an organic resin coated foil in step 118 and step 122 described below, separate organic insulator and metal layers are applied sequentially.

In step 120, the foil 801 of the first organic resin coated foil is patterned to form a first thermally conductive patch 804, a second thermally conductive patch 902, and a third thermally conductive patch 904, which respectively overlie the first set of resistive traces 602, the second set of resistive traces 702, and the third set of resistive traces 704. Each particular thermally conductive patch serves to laterally distribute heat generated by the set of resistive traces that the particular conductive thermally conductive patch overlies. The thermally conductive patches 804, 902, 904 thereby, establish zones of relatively uniform temperature. Such zones are useful in maintaining the temperature of temperature sensitive apparatus that are positioned within them. The thermally conductive patches 804, 902, 904 are preferably not connected to metallization traces which could dissipate heat. The foil 801 of the first organic resin coated foil can be patterned to form the thermally conductive patches 804, 902, 904 in the same manner used to pattern the metal films 306, 310 as described above.

In step 122 a second organic resin coated foil that comprises a foil 1102, and a organic resin layer 1101 is laminated over the first organic resin coated foil with the organic resin layer 1101 of the second organic resin coated foil facing the foil layer 801 of the first organic resin coated foil. The method 100 then continues with step 202 shown in FIG. 2.

In step 202 the foil layer 1102 of the second organic resin coated foil is patterned to define the outline of a conduit 1004 that pass over the thermally conductive patches 804, 902, 904. The conduit 1004 pass through the zones of relatively uniform temperature established by the three thermally conductive patches 804, 902, 904. Embodiments are described below with reference to FIGS. 12–17, in which temperature sensitive apparatus other than conduits are located in a zone of relatively uniform temperature established by a thermally conductive patch.

In step 204 at least a portion of the foil 1102 of the second organic resin coated foil, including the area of the conduit 1004 is coated with a polymeric coating 1106. The polymeric coating 1106 is preferably chemically inert, in particular inert with respect to a genetic material that the integrated heater and fluid conduit 1100 is used to process according to the preferred embodiment. The polymeric coating 1106 preferably comprises a liquid epoxy such as that sold under the trade name "Probelec CFP" by Vantico corporation of Los Angeles, Calif.

In step 205 the polymeric coating 1106 is exposed to ultraviolet to partially cure the polymeric coating 1106.

Figure 12:
FIG. 12 is a fragmentary sectional elevation view of separate carrier layer bearing polymeric layers that is incorporated into the circuit board based integrated heater and fluid conduit shown in FIG. 11.

In step 206 a separate carrier 1108 is coated with a photodefinable polymer layer 1110. The photodefinable polymer layer 1110 is preferably the same material coated on the foil 1102 of the second organic resin coated foil in step 204. The separate carrier 1108 is preferably a piece of copper foil. The separate carrier is also shown in FIG. 12.

In step 208 the photodefinable polymer layer 1110 on the separate carrier 1108, and the polymeric coating 1106 on the second foil 1102 are dried, to at least partially drive off a solvent.

In step 210 the photodefinable polymer layer 1110 on the separate carrier 1108 is patterned, by patternwise exposure to optical radiation, followed by development. Patterning performed in step 210 forms a first opening 1112 in the photodefinable polymer layer 1110 that is used to introduce a solution of biochemicals or other fluid into the conduit 1004, a second opening 1114 that is used to extract the solution of biochemicals or other fluid from the conduit 1004, and an opening over each thermally conductive patch for accommodating a temperature sensor. A third opening 1118 that is subsequently used to accommodate a temperature sensor 1120 over the first thermally conductive patch 804 is visible in FIGS. 11, 12. Alternatively, a surface mount temperature sensor such as a surface mount packaged diode is used.

In step 212, the photodefinable polymer layer 1110 on the separate carrier is cured, by exposure to ultraviolet, elevated temperature, or a combination thereof.

In step 214 the photodefinable polymer layer 1110 on the separate carrier is coated with an additional layer of polymer 1116, which is preferably the same material as the photodefinable polymer layer 1110. The additional layer 1116 is applied thinly so that it need not be patterned to form the orifices aligned with openings 1112, 1114, 1118 in the photodefinable polymer layer 1110.

In step 215 the photodefinable polymer layer 1110, and the additional layer 1116 are blanket exposed to ultraviolet light to partially cure the layers 1110, 1116. Alternatively, the additional layer 116 is patternwise exposed to ultraviolet radiation according to the same pattern used to expose the photodefinable polymer layer 1110.

In step 216, the additional layer of polymer 1116 on the separate carrier 1108 is brought into contact with the layer of polymer 1106 on the second foil 1102, and the separate carrier 1108 with the layers of polymer 1110, 1116 is laminated to the layer of polymer 1106 on the second foil 1102, thereby closing off the top of the conduit 1004. The additional layer of polymer 1116 which is not fully uncured at the time of lamination aids in bonding the layer of polymer 1110 on the separate carrier 1108, with the layer of polymer 1106 on the second foil 1102.

In step 218 polymer layers 1106, 1110, 1116 are subjected to a thermal curing step for the purpose of curing and bonding.

In step 220 the carrier 1108 (now a part of the integrated heater and fluid conduit 1100) is patterned to define: openings aligned with the openings (e.g., 1112, 1114, 1118) in the polymer layer 1110, interconnect traces for electrical components, and optionally other thermal, fluidic, and/or mechanical structures.

In step 222 plated vias (not shown) are formed through the circuit board based integrated heater and fluid conduit 1100.

In step 224 electrical components are mounted on the interconnect traces formed from the carrier 1108. The temperatures sensor 1120 is located in the opening 1118 and is surrounded by a silicone fill 1122. Leads of the temperature sensor 1120 are attached to a third metallization trace 1124, and a fourth metallization trace 1126 that are formed from the carrier 1108. A feedback temperature controller integrated circuit 1128 is coupled to the temperature sensor 1120 by the third 1124, and fourth 1126 metallization traces. The integrated circuit 1128 is also coupled to at least a fifth metallization trace 1134. At least the fifth metallization trace 1134 is coupled to the first metallization trace 408 or the second metallization trace 410 that are located on the second surface 308 of the substrate 302, by vias (not shown) that pass through the integrated heater and fluid conduit 1100. Alternatively, other arrangements of interlayer vias and traces at different metallization layers are used to couple the resistive traces with the integrated circuit 1128, or to couple the temperature sensor 1120 to the integrated circuit. The temperature controller integrated circuit 1128 is electrically coupled to the first set of resistive traces 602. The temperature controller integrated circuit 1128 controls a voltage or current supplied to the first set of resistive traces 602, based on temperature measurements made with the temperature sensor 1120, in order to maintain the temperature in the zone of relatively uniform temperature above the first thermally conductive patch 804. Additional temperature controllers (not shown) are preferably provided for controlling the temperature above the second 902 and third 904 thermally conductive patches. The additional temperature controllers can be integrated with the temperature controller integrated circuit 1128, or provided in separate integrated circuits. Alternatively, the integrated circuit is located in a separate assembly that is coupled to the integrated heater and fluid conduit 1100 through a connector e.g., a board edge connector.

In step 226 a first fluid coupling fitting 1130 is attached over the first opening 1112, and a second fluid coupling fitting 1132 is attached over the second opening 1114. The fluid coupling fittings 1130, 1132 are preferably attached by adhesive, and are alternatively coupled mechanically.

The circuit board based integrated heater and fluid conduit 1100 is particularly suitable for processing a liquid by cycling its temperature between temperatures corresponding to the temperature zones corresponding to the three thermally conductive patches 804, 902, 904. One process that involves such temperature cycling is chemical amplification of deoxyribonucleic acid (DNA) by polymerase chain reaction (PCR). In conducting a PCR reaction using the circuit board based integrated heater and fluid conduit 1100, a PCR reaction mixture is introduced into the conduit 1104 through the first opening 1112, and flows through the conduit 1004 cyclically reaching the different temperature zones corresponding to the thermally conductive patches 804, 902, 904, and is extracted through the second opening 1114. The conduit 1104 can be extended to include more or less segments depending on the degree of DNA amplification required. A series of short zig-zag segments can be included to cause the PCR reaction mixture to dwell in a particular temperature zone as desired.

The conduit 1104 fabricated as described above is alternatively used for other applications such as for example circulating a cooling liquid near semiconductor components, and coupling light signals from a first device to a second device. The conduit 1104 is alternatively fabricated according to the steps described above on a base that does not include the resistive traces 602, 702, 704, or the thermally conductive patches 804, 902, 904. The conduit 1104 has utility beyond use in conjunction with thermal elements. The method for forming the conduit 1104 described above with reference to steps 202–218 of FIG. 2 is well suited to mass production, and is capable of manufacture conduits having widths at least as small as 100 microns. Small widths are advantageous in that they allow small volumes of fluid (e.g., PCR reaction mixture), the availability of which may be limited, to be processed using the integrated heater and fluid conduit 1100.

Alternatively, conduits fabricated by methods others than that described above are mounted on a base that includes the resistive traces 602, 702, 704, and the thermally conductive patches 804, 902, 904.

Figure 13:
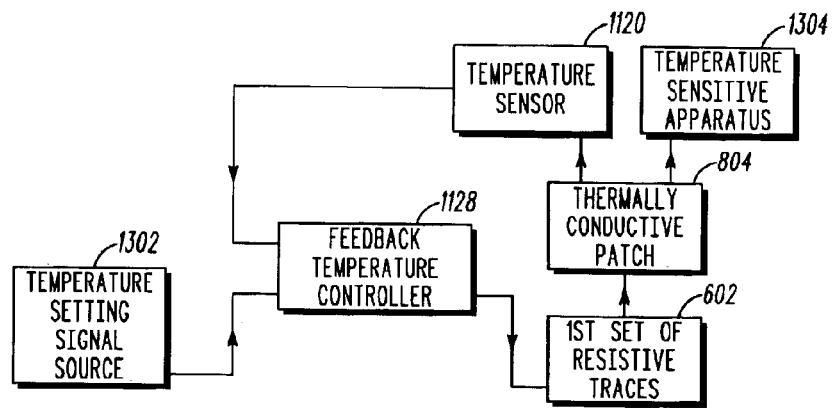
FIG. 13 is a block diagram of a temperature control system according to the preferred embodiment of the invention.

FIG. 13 is a block diagram of a temperature control system 1300 that is embodied in the integrated heater and fluid conduit 1100 according to the preferred embodiment of the invention. A temperature setting signal source 1302 and the temperature sensor 1120 are electrically coupled to inputs of the feedback temperature controller 1128. The temperature setting signal source 1302 can for example comprise a voltage divider, a potentiometer or a microprocessor controlled voltage source. An output of the feedback temperature controller 1128 is electrically coupled to the first set of resistive traces 602. The feedback temperature controller 1128 supplies power to the set of resistive traces 602. Power supplied to the first set of resistive traces 602 is derived from a power source, e.g., battery (not shown). The set of resistive traces 602 are thermally coupled through the first thermally conductive patch 804 to the temperature sensor 1120, and what is designated in FIG. 13 as a temperature sensitive apparatus 1304. In the integrated heater and fluid conduit 1100, the temperature sensitive apparatus 1304 is embodied by the fluid conduit 1004 and a fluid (e.g., PCR reaction mixture) passing through the fluid conduit 1004. Other types of temperature sensitive apparatuses can be supported over the thermally conductive patch 804, as for example described below with reference to FIGS. 15, 16.

The temperature control system 1300 beneficially maintains the operating temperature of the temperature sensitive apparatus 1304 at a desired value.

In the alternative case that the resistive traces 602 comprise a PTCR material, then the resistive traces are preferably directly coupled to a power source. Optionally the feedback temperature controller 1128 is used in conjunction with PTCR resistive traces as well.

Figure 14:
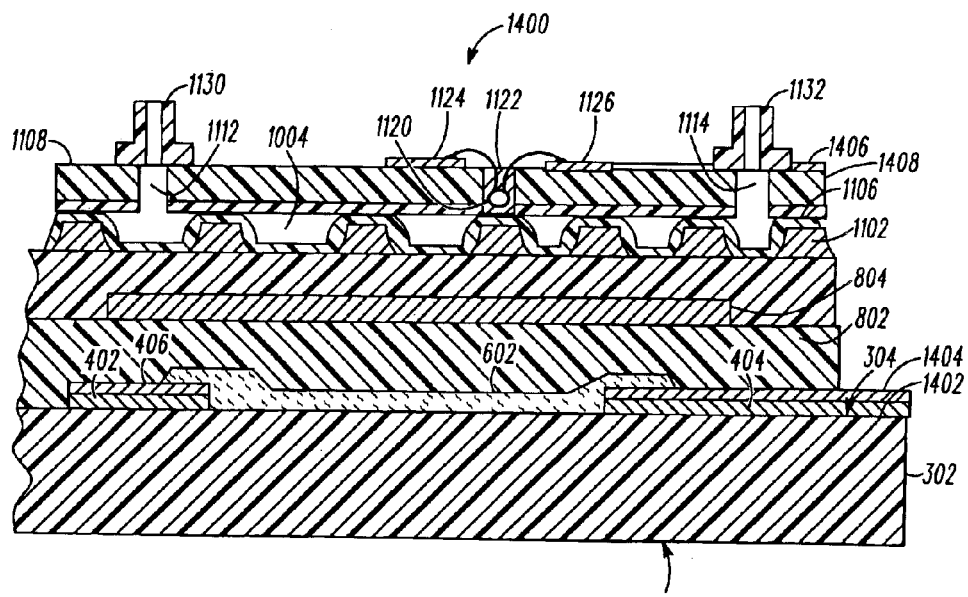
FIG. 14 is a fragmentary sectional elevation view of a printed circuit with integrated heater and fluid conduit according to a first alternative embodiment of the invention.

FIG. 14 is a fragmentary sectional elevation view of a printed circuit with integrated heater and fluid conduit 1400 according to a first alternative embodiment of the invention. In the embodiment shown in FIG. 14, the dielectric circuit substrate 302 includes an extending portion 1402 that extends beyond the periphery of overlying layers, and contact terminals suitable for connecting to a board edge connector are formed on the extending portion 1402. For example as seen in the sectional elevation view of FIG. 14, the second contact terminal 404 for the first set of resistive traces 602 is extended to form a contact terminal 1404 for connection to an external board edge connector (not shown). Other contact terminals (i.e., 402, 502, 504, 506, 508) are also connected by metallization traces formed from the first metal film 306 to contact terminals on the extending portion 1402. In the first alternative embodiment 1400, the third 1124 and fourth 1126 metallization traces are also extended to form contact terminals e.g., 1406 disposed proximate an edge 1408 of the carrier 1108. The latter contact terminals are also suitable for coupling to a board edge connector. The first alternative embodiment is suitable for use in as system in which other electrical components e.g., the integrated circuit temperature controller 1128 is located in a separate apparatus that is coupled to the printed circuit with integrated heater and fluid conduit 1400 through one or more board edge connectors.

Figure 15:
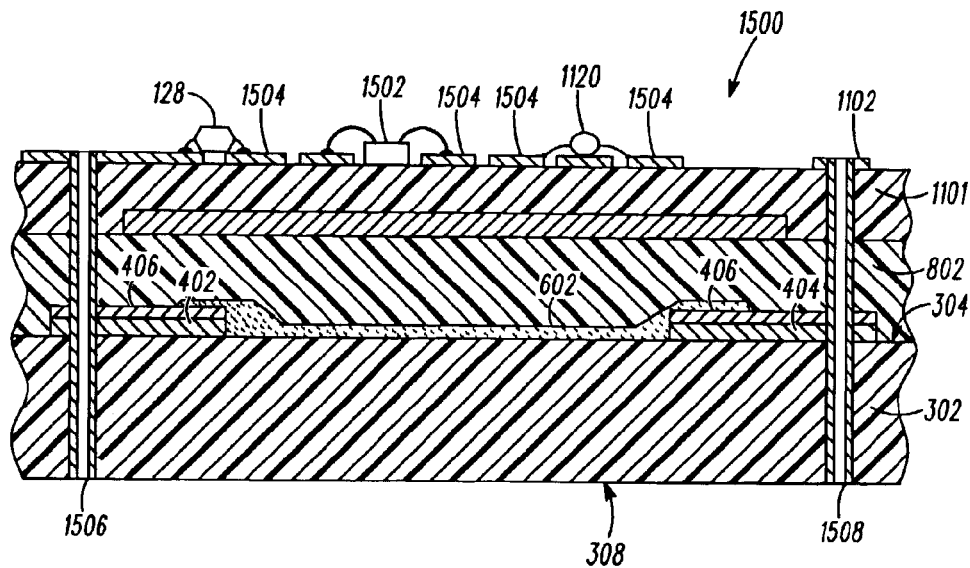
FIG. 15 is a fragmentary sectional elevation view of a circuit board with integrated heater, supporting a temperature sensitive component, according to a second alternative embodiment of the invention.

FIG. 15 is a fragmentary sectional elevation view of a second alternative circuit board with integrated heater 1500, supporting a temperature sensitive component 1502 according to the second alternative embodiment 1500, rather than using the foil layer 1102 of the second organic resin coated foil to form the conduit 1004, the foil layer 1102 is used to form a metal interconnect layer 1504 for electrical components, including the temperatures sensitive component 1502. There are a variety of types of temperature sensitive electrical components that can be advantageously mounted on the circuit board with integrated heater 1500. The temperature sensitive electrical component 1502 comprises, for example, a temperature controlled crystal oscillator, a ceramic filter such as a surface acoustic wave device, or a crystal based filter. Temperature controlled crystal oscillators, and surface acoustic wave devices are two types of frequency selective devices. Alternatively, non-electrical temperature sensitive components are advantageously mounted on the circuit board with integrated heater 1500. For example the temperature of temperature sensitive electro-optical devices such as optical attenuators can advantageously be controlled by mounting on the circuit board with integrated heater 1500. Such components can interact e.g., through an attenuated light beam with opto-electronic components e.g., photodiodes mounted on the circuit board with integrated heater 1500. In the second alternative embodiment it is optional but not necessary to provide more than one set of resistive traces 602, or one thermally conductive patch 804.

A first plated via 1506, and a second plated via 1508 are provided for electrically connecting the first contact terminal 402, and the second contact terminal 404 with the interconnect layer 1504 formed from the foil 1102.

Figure 16:
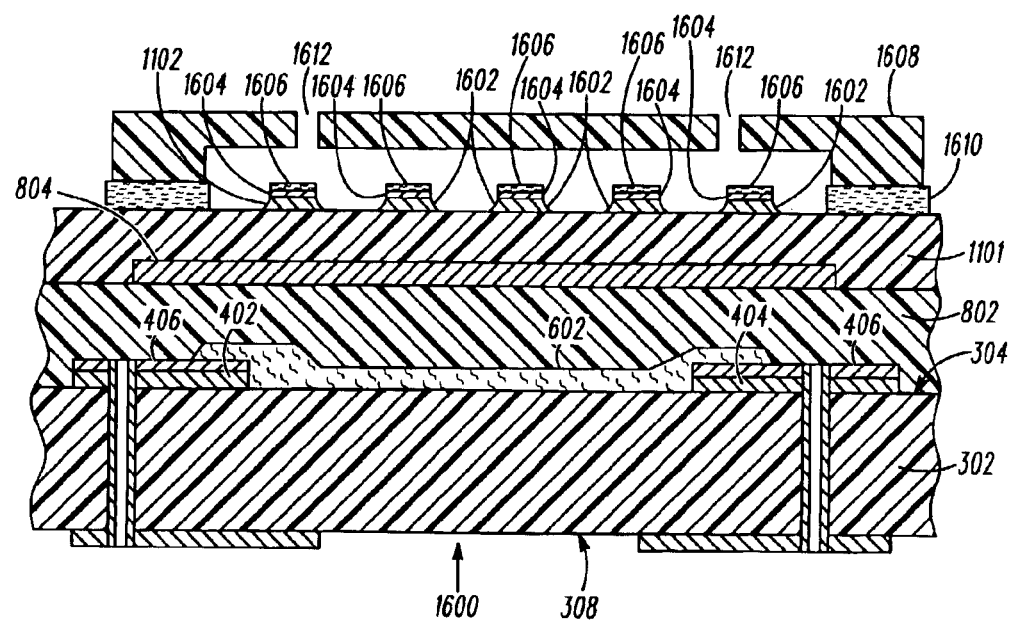
FIG. 16 is a fragmentary sectional elevation view of a circuit board based biosensor apparatus including an integrated heater, and biosensor chamber according to a third embodiment of the invention.

FIG. 16 is a fragmentary sectional elevation view of a circuit board based biosensor apparatus 1600 according to a third alternative embodiment of the invention. In the biosensor apparatus 1600 the foil 1102 of the second organic resin coated foil is patterned to define a number of pads 1602. The pads 1602 are plated with gold 1604, and thereafter a bioactive self assembled monolayer 1606 that includes DNA capture probes, insulator molecules, and conductive molecules is formed on the gold 1604. An inverted cup 1608 that is attached to the resin layer 1101 by an adhesive 1610 surrounds the pads 1602. The cup 1608 includes openings 1612 for admitting or extracting solutions including genetic material to be tested. Metallization traces (not shown) extend from the pads through the adhesive 1610 to a measurement circuit such as a voltammetry circuit (not shown).

In operation, DNA to be tested along with signaling probe molecules that include DNA segments complementary to DNA being tested for and electrochemically oxidizable or reducible groups (e.g., ferrocene) are introduced through one of the openings 1612. The signaling probes selectively bond to complementary first segments of DNA being tested. Second segments of the DNA being tested selectively bonds to the capture probes included in the self assembled monolayer 1606, thereby electrically coupling the signaling probes to the pads 1602. The foregoing processes are temperature sensitive and are preferably performed at between 37 and 40 C. When a signal is applied by the voltammetry circuit to the pads 1602, a current will be detected in the case that the DNA being test for is present, because such DNA will have bonded to the signaling probes that include the electrochemically oxidizable or reducible groups to the capture probes, and a current related to oxidation of the ferrocene groups will be induced. Further details of the self assembled monolayer 1606, and the voltammetry technique which are outside the main focus of the present invention are known to persons of ordinary skill in the genomics arts.

Figure 17:
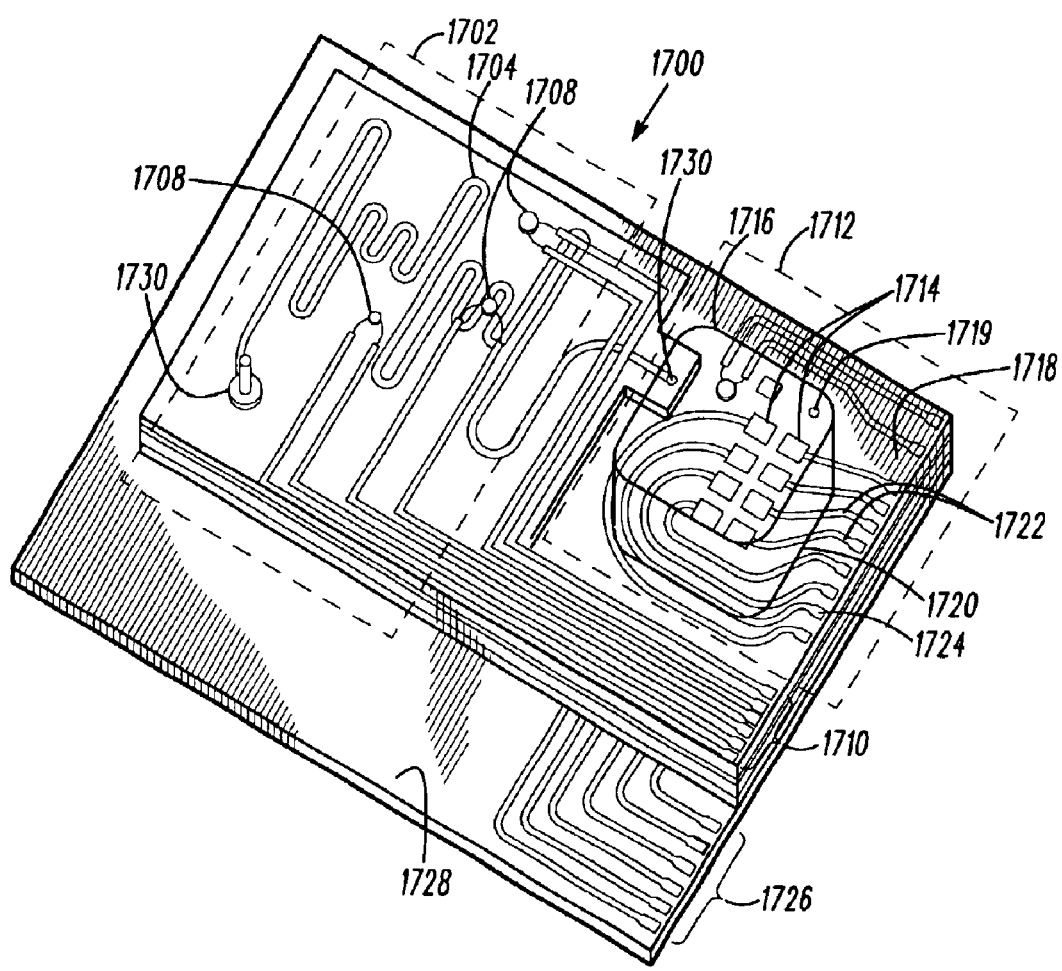
FIG. 17 is a partial x-ray perspective view of a circuit board based DNA analysis apparatus according to a fourth alternative embodiment of the invention.

FIG. 17 is a partial x-ray perspective view of a circuit board based DNA analysis apparatus 1700 according to a fourth alternative embodiment of the invention. A first section 1702 of the apparatus 1700 includes resistive traces, (not shown), thermally conductive patches (not shown), and a conduit 1704 constructed in similar fashion to the embodiments shown in FIGS. 11, 14. The fluid conduit 1704 passes back and forth through three different temperature zones, the temperatures of which are chosen to cause repeated cycles of the PCR reaction to occur. A fluid coupling fitting 1706 is provided over a first opening (not shown) of the conduit 1704, and is used to introduce a PCR reaction mixture into the conduit 1704. Temperature sensors 1708 are used to sense the temperature of three different temperature zones established by thermally conductive patches underlying the conduit 1704. Metallization traces 1710 formed from a patterned carrier are connected to the temperature sensors 1708 and extend to end portions that serve as a first set of board edge connector terminals. A second set of board edge connector terminals 1726 formed from a metal layer located on a dielectric circuit substrate 1728 are used to connect contact terminals (not shown) for resistive traces (not shown) for the three temperature zones to an external power source.

A second section includes a biosensor apparatus 1712 constructed in similar fashion to that shown in FIG. 16. The biosensor apparatus 1712 comprises a plurality of exposed pads 1714 located under an inverted cup 1716. The cup 1716 is bonded to a polymer layer 1718 by an adhesive 1720. Metallization traces 1722 extend from the exposed pads 1714 through the adhesive 1720 to a third set of board edge connector terminals 1724. The exposed pads 1714 are preferably gold plated, and are covered with a self assembled monolayer of the type discussed above with reference to FIG. 16.

A second opening 1730 of the conduit 1704 is located under the cup 1716 such that reaction products pass from the conduit 1704 into a space under the cup 1716 that includes the exposed pads 1714. The cup 1716 includes vent 1719 to prevent pressure build up.

In use the apparatus 1700 is connected through a board edge connector to external circuits that: supply power for heating the three temperature zones through the second set of board edge connector terminals 1726, read the temperatures of the three different temperature zones through the metallization traces 1710, and apply voltammetry signals to the pads 1714 through the third set of board edge connector terminals 1724.

In operation a PCR mixture is introduced through the fluid coupling fitting 1706, flows through the conduit 1704 while a PCR reaction takes place to amplify DNA in the PCR mixture, and flows into the biosensor apparatus 1712, where voltammetry is performed to test for the presence of specific DNA sequences.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

What is claimed is:

1. An integrated electromechanical apparatus comprising:
   a support;
   a first layer supported on the support;
   one or more grooves in the first layer, the one or more grooves characterized by a depth;
   a coating of a first material over the first layer, said coating conforming to the one or more grooves, wherein the coating is at least in part thinner than the depth of the one or more grooves;
   a photodefined cap layer supported on the coating sealingly engaged with the coating, so as to form one or more conduits in the one or more grooves.

2. The integrated electromechanical apparatus according to claim 1 wherein:
   the first layer is metal.

3. The integrated electromechanical apparatus wherein according to claim 2 wherein:
   the one or more grooves are formed by etching.

4. The integrated electromechanical apparatus according to claim 1 wherein:

the first material is selected from a group consisting of epoxy resin, and polyimide.

5. The integrated electromechanical apparatus according to claim 4 wherein:

the photodefined cap layer comprises a material selected from the group consisting of epoxy resin, and polyimide.

6. The integrated electromechanical apparatus according to claim 1 wherein:

the photodefined cap layer includes one or more photodefined orifices aligned with the one or more grooves.

7. The integrated electromechanical apparatus according to claim 1 wherein the support comprises:

one or more additional layers, wherein the one or more additional layers include a heater, for heating a fluid flowing in at least one of the one or more conduits.

8. A method of fabricating an integrated electromechanical apparatus, the method comprising:

obtaining a support with a first layer supported on the support;

patterning the first layer to form one or more grooves;

coating the first layer with a first material;

attaching a film to the first material;

whereby, the film closes the one or more grooves forming one or more conduits.

9. The method according to claim 8 wherein:

coating the first layer with a first material comprises:

coating the first layer with a biochemically inert polymer.

10. The method according to claim 9 wherein:

obtaining a support with a first layer supported on the support comprises:

obtaining a support with a layer of copper supported on the support.

11. The method according to claim 10 wherein:

coating the first layer with a first material comprises:

coating the first layer with a biochemically inert polymer.

12. The method according to claim 11 wherein:

attaching the film to the first material comprises:

attaching a biochemically inert polymer to the first material.

13. The method according to claim 8 wherein attaching the film to the first material comprises:

coating the film with an uncured polymer; and contacting the uncured polymer on the film with the first material.

14. The method according to claim 13 further comprising:

prior to contacting the uncured polymer on the film with the first material;

exposing the uncured polymer to ultraviolet; and exposing the first material to ultraviolet.

15. The method according to claim 13 wherein:

the first material is selected from the group consisting of epoxy resin, and polyimide; and the uncured polymer is selected from the group consisting of epoxy resin, and polyimide.

16. The method according to claim 13 wherein prior to attaching the film to the first material, the film is supported on a separate carrier.

17. The method according to claim 16 wherein after attaching the film to the first material, the separate carrier is patterned.

18. The method according to claim 8 further comprising the step of:

forming openings in the film.

19. The method according to claim 18 wherein:

the step of forming openings in the film is performed prior to the step of attaching the film to the first material.

20. The method according to claim 19 wherein the step of forming openings in the film comprises the step of photodefining openings in the film.

* * * * *